US012598833B2

(12) United States Patent
Onuki

(10) Patent No.: US 12,598,833 B2
(45) Date of Patent: Apr. 7, 2026

(54) PHOTOELECTRIC CONVERSION DEVICE AND APPARATUS

(71) Applicant: CANON KABUSHIKI KAISHA, Tokyo (JP)

(72) Inventor: Yusuke Onuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 462 days.

(21) Appl. No.: 18/360,589

(22) Filed: Jul. 27, 2023

(65) Prior Publication Data

US 2024/0038816 A1 Feb. 1, 2024

(30) Foreign Application Priority Data

Aug. 1, 2022 (JP) ................................. 2022-122764

(51) Int. Cl.
| | |
|---|---|
| *H10F 39/00* | (2025.01) |
| *H04N 25/59* | (2023.01) |
| *H04N 25/77* | (2023.01) |
| *H04N 25/771* | (2023.01) |
| *H10F 39/18* | (2025.01) |

(52) U.S. Cl.
CPC .......... *H10F 39/811* (2025.01); *H10F 39/18* (2025.01); *H10F 39/8023* (2025.01); *H10F 39/80373* (2025.01)

(58) Field of Classification Search
CPC .... H10F 39/811; H10F 39/18; H10F 39/8023; H10F 39/80373; H04N 25/59; H04N 25/77; H04N 25/771
See application file for complete search history.

(56) References Cited

U.S. PATENT DOCUMENTS

| | | | |
|---|---|---|---|
| 2020/0075649 A1 | 3/2020 | Arishima et al. | |
| 2020/0075849 A1* | 3/2020 | Arishima | ............... H04N 25/77 |
| 2021/0274111 A1* | 9/2021 | Itano | ...................... H04N 25/78 |
| 2022/0247963 A1* | 8/2022 | Onuki | ................... H04N 25/772 |
| 2025/0133305 A1* | 4/2025 | Sakai | ..................... H04N 25/46 |

* cited by examiner

*Primary Examiner* — Marly S Camargo
(74) *Attorney, Agent, or Firm* — Canon U.S.A., Inc. IP Division

(57) ABSTRACT

There is provided a photoelectric conversion device including a photoelectric conversion unit, a floating diffusion, an amplification transistor, a capacitance addition transistor electrically connected to the floating diffusion. The photoelectric conversion device further includes a metal-oxide semiconductor (MOS) capacitive element and a wiring capacitive element that are electrically connected to the floating diffusion via the capacitance addition transistor.

10 Claims, 9 Drawing Sheets

FIG.9A
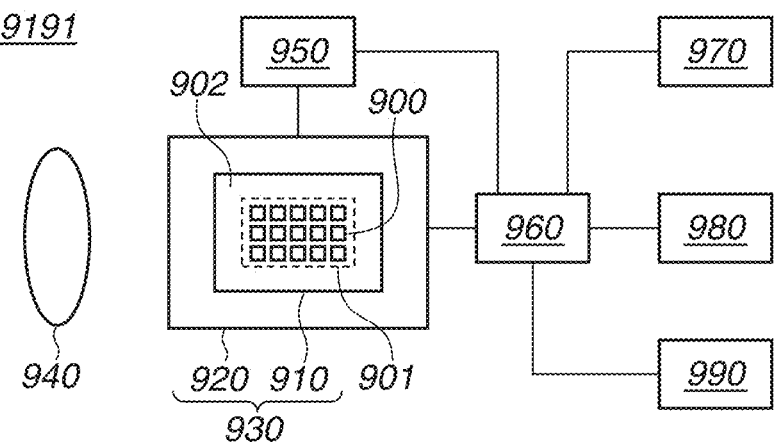
FIG.9B
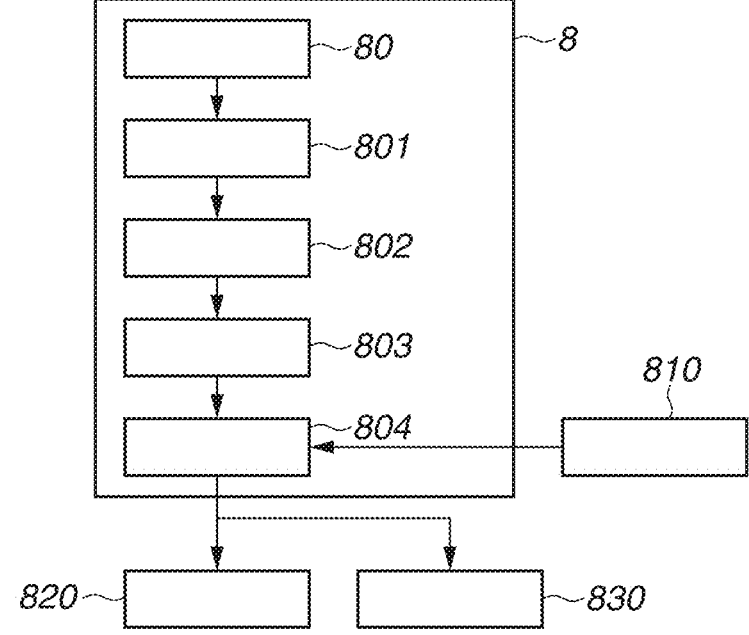
FIG.9C

PHOTOELECTRIC CONVERSION DEVICE AND APPARATUS

BACKGROUND

Field of the Disclosure

The present disclosure relates to a photoelectric conversion device and an apparatus.

Description of the Related Art

Japanese Patent Application Laid-open No. 2020-039114 describes a configuration in which a first capacitance addition transistor is connected to a floating diffusion portion (hereinbelow, referred to as an FD portion) to expand a dynamic range in a photoelectric conversion device. The FD portion is connected to one end of the first capacitance addition transistor, and a reset transistor is connected to the other end of the first capacitance addition transistor.

Japanese Patent Application Laid-open No. 2020-039114 also describes a configuration in which a second capacitance addition transistor is provided between the reset transistor and the first capacitance addition transistor.

SUMMARY

According to an aspect of the present disclosure, a photoelectric conversion device includes a photoelectric conversion unit configured to convert light into charge, a floating diffusion to which the charge is transferred from the photoelectric conversion unit, an amplification transistor electrically connected to the floating diffusion, a capacitance addition transistor electrically connected to the floating diffusion, a metal-oxide semiconductor capacitive element electrically connected to the floating diffusion via the capacitance addition transistor, and a wiring capacitive element electrically connected to the floating diffusion via the capacitance addition transistor.

Further features of the present disclosure will become apparent from the following description of embodiments with reference to the attached drawings.

BRIEF DESCRIPTION OF THE DRAWINGS

FIGS. 9A, 9B, and 9C are block diagrams according to a fifth embodiment.

DESCRIPTION OF THE EMBODIMENTS

Figure 1:
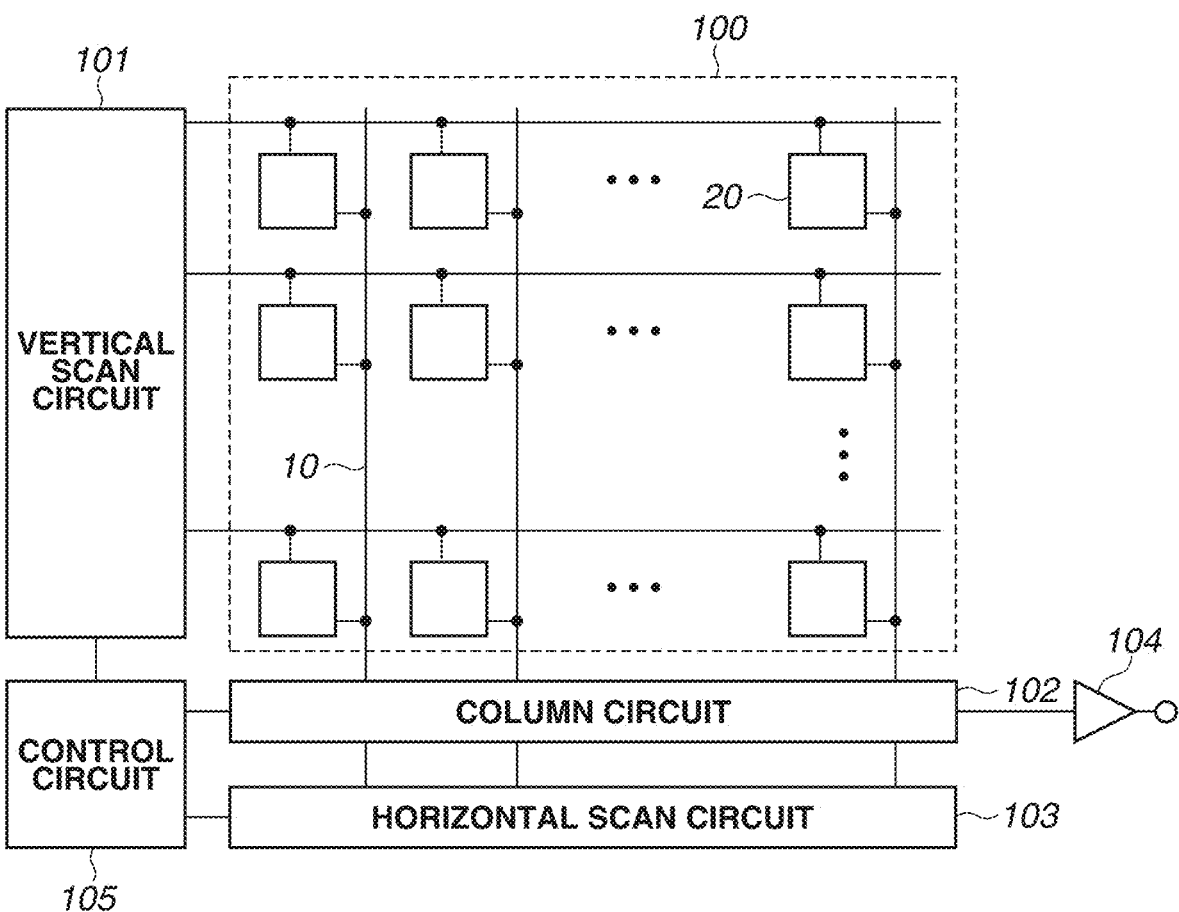
FIG. 1 is a block diagram illustrating a photoelectric conversion device according to a first embodiment.

United States Patent Application Publication No. 2020/0075649 discusses a configuration in which a capacitance is added to a floating diffusion (FD) portion by providing a capacitance addition transistor between a reset transistor and the FD portion, and conducting electricity (turning on) the capacitance addition transistor. The capacitance added by controlling the capacitance addition transistor is a Metal-Oxide Semiconductor (MOS) capacitance. The MOS capacitance may become large in voltage dependency of capacitance depending on an operating point of the FD portion, and the linearity characteristics of the MOS capacitance may decrease. In a case where the area of the MOS capacitance is large, the saturation charge quantity may decrease because of the restriction of the area of the photoelectric conversion portion in relation to the pixel size. Thus, the present disclosure generally provides a photoelectric conversion device improved in characteristics more than that in United States Patent Application Publication No. 2020/0075649.

Hereinbelow, embodiments will be described with reference to the attached drawings. Note that the embodiments described below are not intended to limit the present disclosure related to the range of claims. In the embodiments, a plurality of features is described, but not all the features are necessarily essential, and the plurality of features may be combined arbitrarily. In the attached drawings, the same or similar components are assigned the same reference numbers, and the redundant descriptions thereof are omitted.

The embodiments will be described, focusing on a complementary metal-oxide semiconductor (CMOS) sensor which is an example of the photoelectric conversion device. The embodiments are not limited to the CMOS sensor, and is applicable to other examples of the photoelectric conversion device. Examples of the photoelectric conversion device include a charge-coupled device (CCD) sensor, an imaging device, a distance measurement apparatus (apparatus for measuring a distance using a focus detection method or a Time Of Flight (TOF) method), and a light metering device (device for measuring an amount of incident light). The description will focus on a front surface irradiation (FSI) type photoelectric conversion device, but the embodiments are applicable to a back surface irradiation (BSI) type photoelectric conversion device.

In the present specification, terms indicating specific directions and positions (e.g., "up", "down", "right", "left", and different terms including these terms) are used as appropriate. These terms are used to facilitate the comprehension of the embodiments in conjunction with the accompanying drawings, and not intended to limit the technical scope of the present disclosure by the meanings of the terms. In the present disclosure, a "plane surface" indicates a surface parallel to a main surface of a semiconductor substrate. The main surface of the semiconductor substrate can be a light incident surface of the semiconductor substrate including photoelectric conversion elements and a surface in which a plurality of analog-to-digital converters (ADCs) are repeatedly arranged. A "planar view" indicates a view seen from a direction perpendicular to the main surface of the semiconductor substrate. Further, a "cross-section" indicates a surface of the semiconductor layer in a direction perpendicular to the light incident surface of the semiconductor layer. A "cross-section view" indicates a view seen from a direction parallel to the main surface of the semiconductor substrate.

A first embodiment will be described with reference to FIGS. 1, 2, 3A, and 3B.

FIG. 1 is a block diagram schematically illustrating a photoelectric conversion device according to the present embodiment. The photoelectric conversion device includes a pixel array 100, a vertical scan circuit 101, a column circuit 102, a horizontal scan circuit 103, an output circuit 104, and a control circuit 105.

The pixel array 100 includes a plurality of unit pixels 20 arranged in an X-Y matrix. The area in which the pixel array 100 is provided is also referred to as a pixel area.

The vertical scan circuit 101 supplies a control signal for controlling transistors provided in the unit pixels 20 to turn on or off. Logical circuits, such as a shift register and an address decoder, are used for the vertical scan circuit 101.

Vertical output lines 10 are provided to the corresponding columns of the unit pixels 20, and the signals from the unit pixels 20 in each column are read out to the vertical output line 10. The number of the vertical output lines 10 for each pixel column is not necessarily one, and a plurality of vertical output lines may be provided for one pixel column.

The column circuit 102 includes an amplifier for amplifying each pixel signal output to the corresponding vertical output line 10. The column circuit 102 performs correlated double sampling processing based on a signal at a reset and a signal at a photoelectric conversion, thus performing noise reduction processing. Further, the column circuit 102 includes an analog-to-digital (AD) conversion unit for converting an analog signal into a digital signal. The amplifier provided in the column circuit 102 can be omitted. The AD conversion unit may be provided to each of the unit pixels 20 to output a digital signal from each of the unit pixels 20.

The horizontal scan circuit 103 supplies control signals for controlling corresponding switches provided in the column circuit 102 to turn on or off. In this way, the signals held in the column circuit 102 are output to the output circuit 104.

The output circuit 104 includes a buffer amplifier and a differential amplifier, and outputs the signals from the column circuit 102 to a signal processing unit external to the photoelectric conversion device.

Figure 2:
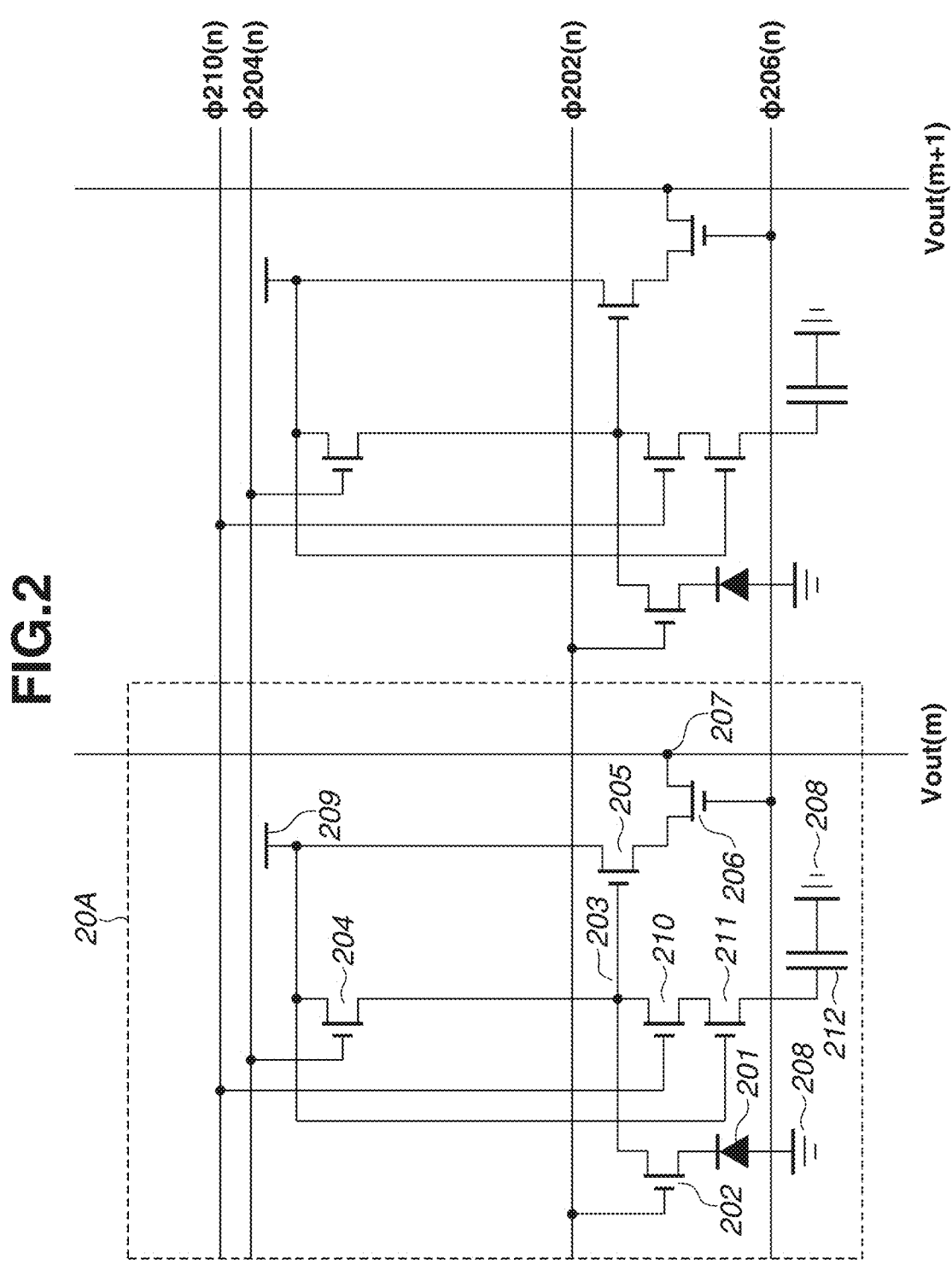
FIG. 2 is a pixel circuit diagram according to the first embodiment.

FIG. 2 illustrates an equivalent circuit of unit pixels 20A of the photoelectric conversion device according to the present embodiment. While FIG. 2 illustrates two unit pixels 20A in 1 row×2 columns among the plurality of unit pixels 20A two-dimensionally arranged in row and column directions, the photoelectric conversion device includes further more unit pixels 20A.

Each of the plurality of unit pixels 20A includes a photoelectric conversion unit 201, a transfer transistor 202, and a floating diffusion (hereinbelow, referred to as an FD) 203. Each of the unit pixels 20A includes a reset transistor 204, an amplification transistor 205, and a selection transistor 206. Each of the unit pixels 20A includes an output portion 207 connecting to the corresponding vertical output line 10, grounds 208, and a power source 209.

Further, each of the unit pixels 20A includes a capacitance addition transistor 210 with its one end connected to the FD 203, and an MOS capacitive element 211 with its one end connected to the capacitance addition transistor 210, and a wiring capacitive element 212 with its one end connected to the MOS capacitive element 211. The MOS capacitive element 211 and the wiring capacitive element 212 may be connected in reverse order. More specifically, the capacitance addition transistor 210, the wiring capacitive element 212, the MOS capacitive element 211, the ground 208 may be connected in this order.

One end of the reset transistor 204 is connected to the FD 203, and the other end of the reset transistor 204 is connected to, for example, the power source 209. In other words, the capacitance addition transistor 210 and the reset transistor 204 are connected to the FD 203 in parallel.

In the present embodiment, the wiring capacitive element 212 is, for example, a Metal-Oxide-Metal (MOM) capacitance and a Metal-Insulator-Metal (MIM) capacitance. The MOM capacitance is formed of a first conductor and a second conductor provided in wiring layers at a same height, and an insulator provided between these conductors. In general, the MOM capacitance is advantageous in that the area thereof can be made smaller. The MIM capacitance is formed of a first conductor, an insulation film provided on the first conductor, and a second conductor provided on the insulation film. In general, the MIM capacitance is advantageous in that the capacitance can be made larger. The major component of a conductor constituting the wiring pattern is, for example, copper. For example, more than 90% of the total metal component is copper. The conductor may be made of metal such as aluminum or tungsten. The insulator or the insulation film are typically made of silicon oxide. However, the insulator or the insulation film may be made of silicon nitride, silicon oxynitride, and silicon carbide.

The wiring capacitive element 212 means an intentionally provided element for adding capacitance.

Thus, a member generating unintentional parasitic capacitance does not correspond to the wiring capacitive element 212. For example, the element having a capacitance more than 0.1 fF is the wiring capacitive element 212. However, if the element is intentionally provided to add capacitance, the element with smaller capacitance can be a wiring capacitive element.

The photoelectric conversion unit 201 is made of a positive-negative (PN) junction diode with a charge accumulation region including a first semiconductor region of a first conductivity type (e.g., N-type semiconductor region) and a second semiconductor region of a second conductivity type (e.g., P-type semiconductor region).

The photoelectric conversion unit 201 photoelectrically converts incident light and accumulates the photoelectrically converted charge. More specifically, the transfer transistor 202 and the reset transistor 204 are made conductive (ON state) to reversely bias the PN junction diode. Next, both of the transfer transistor 202 and the reset transistor 204 are made non-conductive (OFF state), to wait for the light incidence. While the reverse bias is being applied as described above, a potential of the ground 208 is supplied to the second semiconductor region (e.g., P-type semiconductor region) of the PN junction diode, and a potential of the power source 209 is supplied to the first semiconductor region (e.g., N-type semiconductor region) of the PN junction diode.

The transfer transistor 202 transfers charge of the photoelectric conversion unit 201 to the FD 203 when the transfer transistor 202 is conductive. The amplification transistor 205 forms a source follower circuit, and outputs a signal based on the voltage of the FD 203 to the vertical output line 10 via the selection transistor 206. In a case where the capacitance addition transistor 210 is in a non-conductive state, the FD 203 accumulates electrons only in the capacitance of the FD 203. On the other hand, in a case where the capacitance addition transistor 210 is in a conductive state, the FD 203 accumulates electrons in the capacitance of the FD 203, the MOS capacitive element 211, and the wiring capacitive element 212. Thus, the capacitance addition transistor 210 is able to switch the capacitance of the FD 203 by switching between the conductive state and the non-conductive state of the transfer transistor 202.

A common control signal is supplied to the unit pixels 20A in the same row from the vertical scan circuit 101. More specifically, control signals $\Phi 202(n)$, $\Phi 204(n)$, $\Phi 206(n)$, and $\Phi 210(n)$ are respectively supplied to the transfer transistors 202, the reset transistors 204, the selection transistors 206, and the capacitance addition transistors 210 in the n-th row. Each of these transistors becomes conductive when the corresponding control signal is in a high level, and becomes non-conductive when the corresponding control signal is in a low level. Each of the capacitance addition transistors 210 is able to connect the additional capacitance to the FD 203 at a timing at which the control signal $\Phi 210(n)$ becomes high in a pulsed manner. The gate electrode of the MOS capacitive element 211 may be made conductive by a pulsed control signal, or, for example, as illustrated in FIG. 2, the power source voltage may constantly be applied.

Next, the MOS capacitive element 211 and the wiring capacitive element 212 will be described in detail. The capacitance addition transistor 210 only needs to be connected to the FD 203 at least at its one end. When the capacitance addition transistor 210 is turned ON, the capacitance resulting from the channel formation of the MOS capacitive element 211 and the inter-wire coupling capacitance of the wiring capacitive element 212 are added to the capacitance of the FD 203. In other words, the MOS capacitive element 211 and the wiring capacitive element 212 are connected to the FD 203 in parallel via the capacitance addition transistor 210. Since the capacitance of the FD 203 increases, the amount of charge storable in the FD 203 increases, thus expanding the dynamic range. When the capacitance addition transistor 210 is OFF, the capacitances related to the above-described MOS capacitive element 211 and the wiring capacitive element 212 are not added to the FD 203, and the capacitance of the FD 203 does not change. In such a case, the amount of voltage change for one charge in the FD 203 (charge-voltage conversion efficiency) can be increased. The term "charge-voltage conversion efficiency is high" can be paraphrased by the term "the sensitivity is high". In this way, the capacitance of the FD 203 (capacitance of the input node), in other words, the sensitivity is switchable, by switching the capacitance addition transistor 210.

As discussed in Japanese Patent Application Laid-open No. 2020-039114, to form the FD additional capacitance only from the MOS capacitive element 211, the area of the MOS capacitive element 211 is to be made larger. In a case where the area of the MOS capacitive element 211 is large, the voltage dependency of the MOS capacitance increases depending on the operation point of the FD 203. In other words, the linearity characteristics may decrease because the charge-voltage conversion efficiency changes depending on the luminance with the occurrence of the capacitance difference between the capacitance when the voltage of the FD 203 is high and the luminance is low and the capacitance when the voltage of the FD 203 is low and the luminance is high. In a case where the area of the MOS capacitive element 211 is large, the area of the photoelectric conversion unit 201 is restricted and, for example, the saturation charge quantity may decrease.

On the other hand, in a case where the FD additional capacitance is formed only of the wiring capacitive element 212, the area of the wiring capacitive element 212 is to be made larger. In a case where the area of the wiring capacitive element 212 is large, the layout of the wiring is restricted. As a result, for example, the sensitivity may decrease in a case where the photoelectric conversion device is the FSI type photoelectric conversion device.

To address this, in the first embodiment, the MOS capacitive element 211 and the wiring capacitive element 212 are connected in parallel to the FD 203 via the capacitance addition transistor 210. This enables the total capacitance of the MOS capacitive element 211 and the wiring capacitive element 212 to serve as the FD additional capacitance. In other words, the areas of the MOS capacitive element 211 and the wiring capacitive element 212 are enabled to be smaller than that in a case where the FD additional capacitance is formed only of the MOS capacitive element 211 or the wiring capacitive element 212. Thus, the dynamic range is expandable without degradation in the saturation charge quantity, the linearity characteristics, and the sensitivity.

Figure 3A:
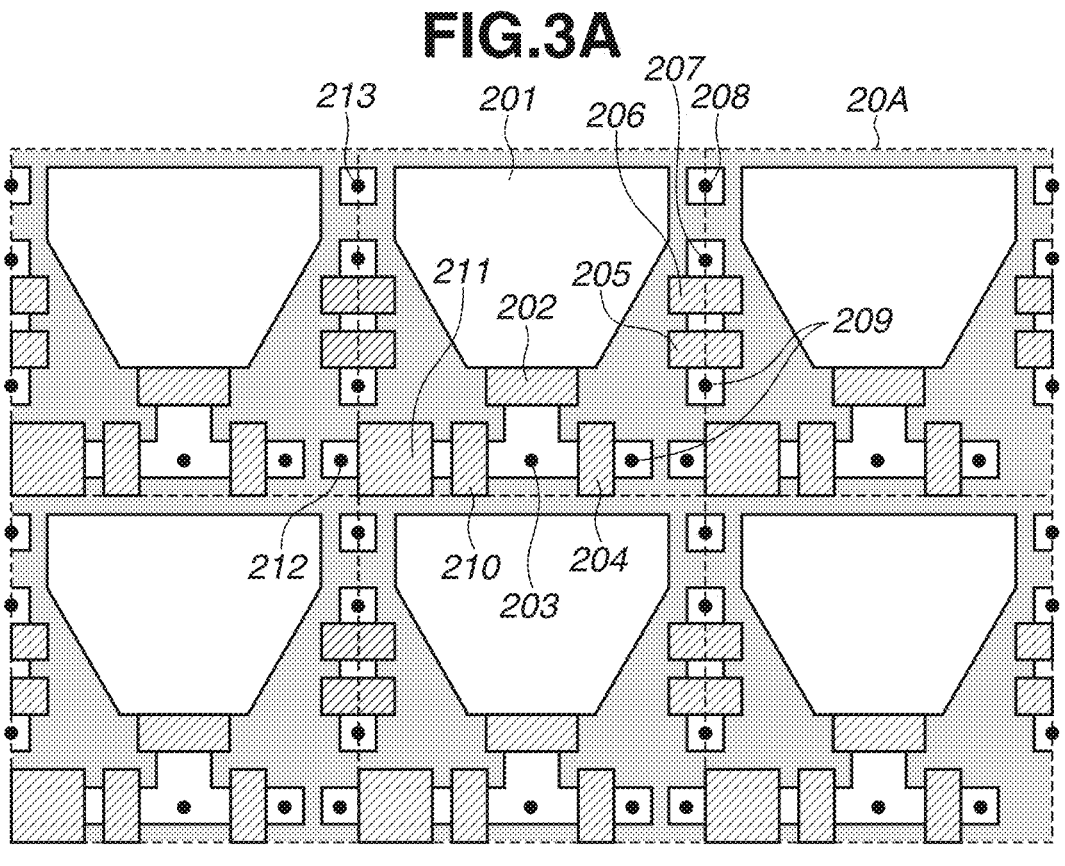
FIGS. 3A and 3B are schematic plan views of a pixel according to the first embodiment.
Figure 3B:
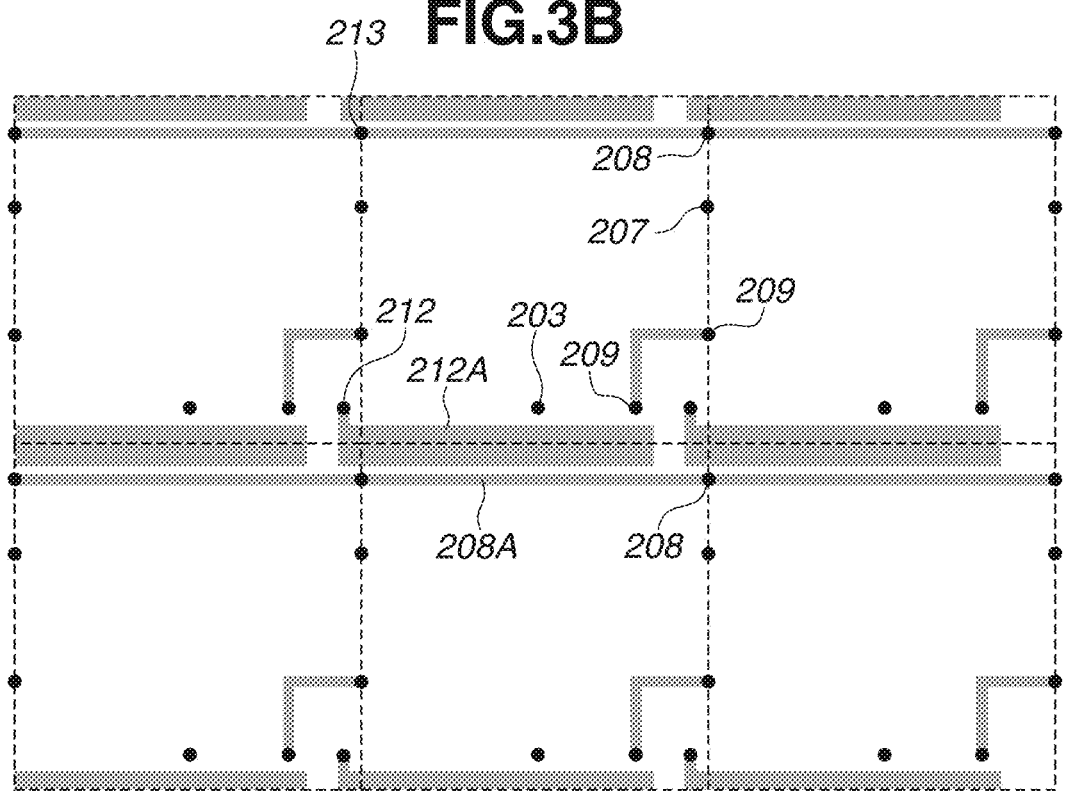

FIGS. 3A and 3B are schematic plan views of unit pixels 20A. FIG. 3A schematically illustrates active regions (indicated by white), field regions (indicated by gray), gate electrodes of transistors (indicated by hatching), and a part of contact plugs 213 (indicated by small black circles), in a unit pixel 20A. The active regions are defined by the field regions. More specifically, each field region includes local oxidation of silicon (LOCOS), shallow trench isolation (STI), and deep trench isolation (DTI). Typically, the field regions are insulator regions, but metal can be filled in the trenches. FIG. 3B illustrates a part of the contact plugs 213, a part of first wiring layer, and a part of second wiring layer in the unit pixels 20A.

In FIG. 3A, the capacitance addition transistor 210 and the reset transistor 204 are connected to the FD 203 in parallel. The MOS capacitive element 211 and the wiring capacitive element 212 are connected to the FD 203 in parallel via the capacitance addition transistor 210. In FIG. 3A, a conductor 212A of the first wiring layer connected via the contact plug 213, and a conductor 208A (trace of ground wiring) of the first wiring layer connected to the ground 208 via the contact plug 213 are arranged to oppose each other via the insulator made of silicon oxide or the like. In other words, the MOM capacitance is formed between the conductors included in the first wiring layer at a same height. In FIG. 3B, the MOM capacitance is formed between the conductor 212A of the first wiring layer and the conductor 208A (trace of ground wiring) of the first wiring layer connected to the ground 208, but the MOM capacitance may be formed between a conductor (trace of power source wiring) of the first wiring layer connected to the power source 209 and another conductor of the first wiring layer. FIG. 3B illustrates the unit pixels 20A in a case where the MOM capacitance is used as the wiring capacitive element 212. In another embodiment, the wiring capacitive element 212 may be an MIM capacitance element, or a combination of a MIM capacitance element and a MOM capacitance element.

As described above, in the present embodiment, the MOS capacitive element 211 and the wiring capacitive element 212 are electrically connected to the FD 203 via the capacitance addition transistor 210. This makes it possible to reduce decrease in the linearity characteristics and restriction on the area of the photoelectric conversion unit 201, as compared with a case where the additional capacitance is formed only of the MOS capacitive element 211. According to present embodiment, it is possible to reduce the restriction on the wiring layout, as compared with a case where the additional capacitance is formed only of the wiring capacitive element 212. This makes it possible to reduce the sensitivity degradation for, in particular, the FSI type photoelectric conversion device.

Hereinbelow, a second embodiment will be described with reference to FIGS. 4, 5A, and 5B.

Figure 4:
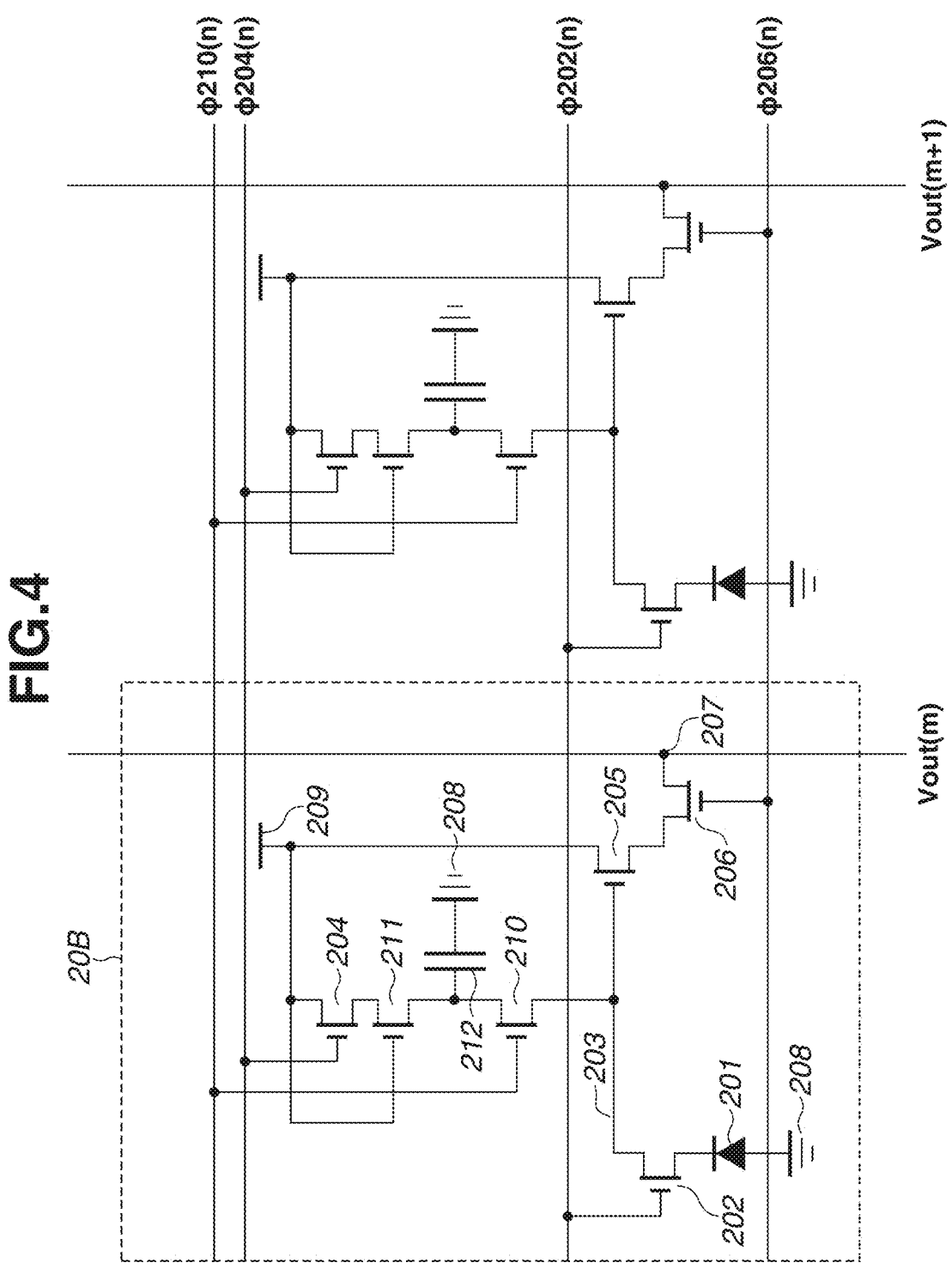
FIG. 4 is a pixel circuit diagram according to a second embodiment.

FIG. 4 illustrates an equivalent circuit of unit pixels 20B of a photoelectric conversion device according to the present embodiment. The unit pixels 20B in FIG. 4 are different from the unit pixels 20A in FIG. 2 in a connection relationship of the capacitance addition transistor 210 and the reset transistor 204 to the FD 203. More specifically, one end of the reset transistor 204 is connected to the MOS capacitive element 211 and to the wiring capacitive element 212 via the MOS capacitive element 211, and the other end of the reset transistor 204 is connected to, for example, the power source 209. In other words, it can also be said that the capacitance addition transistor 210 and the reset transistor 204 are connected to the FD 203 in series. Compared with the case where the capacitance addition transistor 210 and the reset transistor 204 are connected to the FD 203 in parallel, in the second embodiment in which the capacitance addition transistor 210 and the reset transistor 204 are connected in series, it is possible to reduce the FD parasitic capacitance when the capacitance addition transistor 210 is OFF. Since the FD parasitic capacitance is small, it is possible to increase the amount of voltage change for one charge (charge-voltage conversion efficiency), as compared with the case in the first embodiment. The MOS capacitive element 211 and the wiring capacitive element 212 may be connected in reverse order. More specifically, the capacitance addition transistor 210, the MOS capacitive element 211, the wiring capacitive element 212, and the reset transistor 204 may be connected in this order.

Figure 5A:
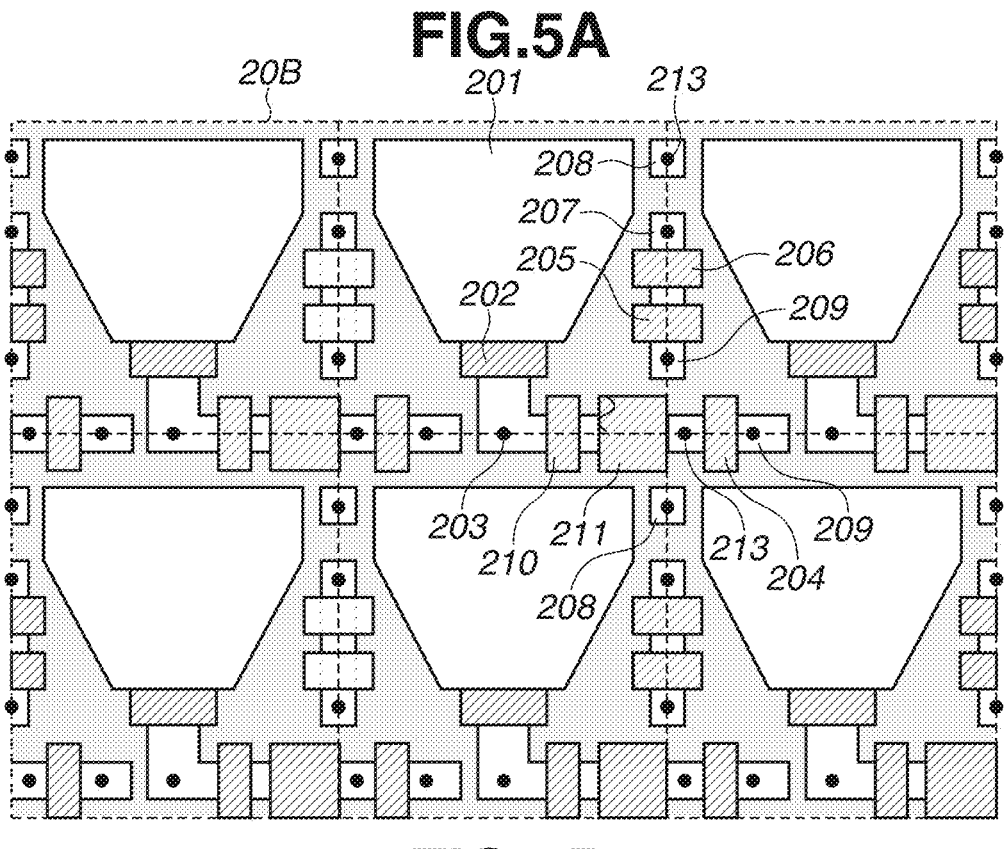
FIGS. 5A and 5B are schematic plan views of a pixel according to the second embodiment.
Figure 5B:
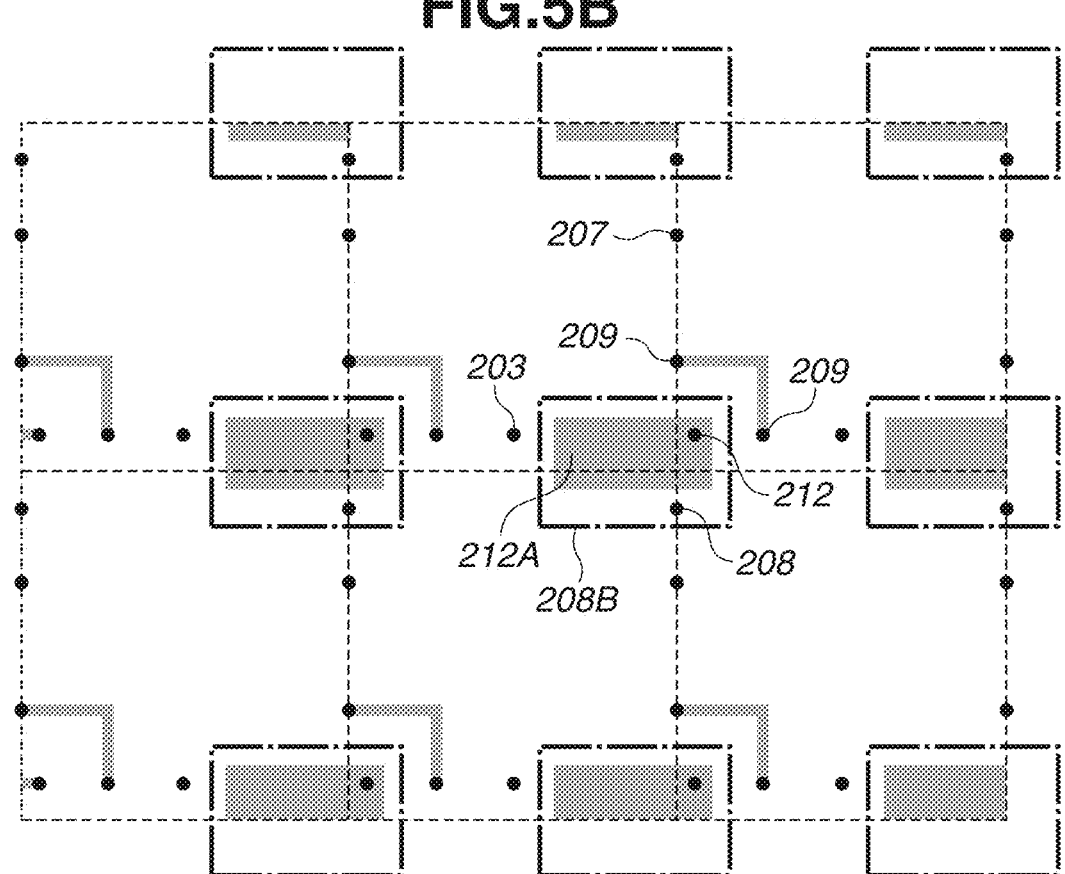

FIGS. 5A and 5B are schematic plan views of the unit pixels 20B. FIG. 5A schematically illustrates active regions, field regions, gate electrodes of transistors, and a part of the contact plugs 213 in the unit pixel 20B. FIG. 5B schematically illustrates a part of the contact plugs 213, a part of first wiring layer, and a part of second wiring layer in a unit pixel 20B. In FIG. 5A, the capacitance addition transistor 210 and the reset transistor 204 are connected to the FD 203 in series. Further, the MOS capacitive element 211 and the wiring capacitive element 212 are connected to the FD 203 in parallel via the capacitance addition transistor 210.

Here, the semiconductor region of the source or the drain of the MOS capacitive element 211 and the contact plug 213 are connected, and the contact plug 213 is connected to the conductor 212A of the first wiring layer. In contrast, the contact plug 213 is connected to the semiconductor region to which the voltage of the ground 208 is supplied. The ground 208 and a conductor 208B of the second wiring layer are electrically connected via the contact plug 213, a conductor (not illustrated) of the first wiring layer, and a via plug (not illustrated) provided in an interlayer insulation film. The conductor 212A of the first wiring layer and the conductor 208B of the second wiring layer are provided to oppose each other, and the insulation film is provided between these conductors, thus forming the MIM capacitance.

In FIG. 5B, the MIM capacitance element is formed between the conductor of the first wiring layer and the conductor 208B of the second wiring layer connected to the ground 208, but the MIM capacitance element may be formed between a conductor of the second wiring layer connected to the power source 209 and another conductor of the second wiring layer. While FIG. 5B illustrates the unit pixel 20B in the case of using the MIM capacitance element, the additional capacitance may be formed of the MOM capacitance element, or a combination of the MIM capacitance element and the MOM capacitance element.

As described above, the MOS capacitive element 211 and the wiring capacitive element 212 are electrically connected to the FD 203 via the capacitance addition transistor 210 in the present embodiment. This makes it possible to reduce decrease in the linearity characteristics and the restriction on the area of the photoelectric conversion unit 201, as compared with a case where the additional capacitance is formed only of the MOS capacitive element 211. According to present embodiment, it is possible to reduce the restriction on the wiring layout, as compared with a case where the additional capacitance is formed only of the MOS capacitive element 211. This prevents the sensitivity degradation for, in particular, the FSI type photoelectric conversion device.

Hereinbelow, a third embodiment will be described with reference to FIGS. 6A, 6B, and 6C.

Figures 6A, 6B, 6C:
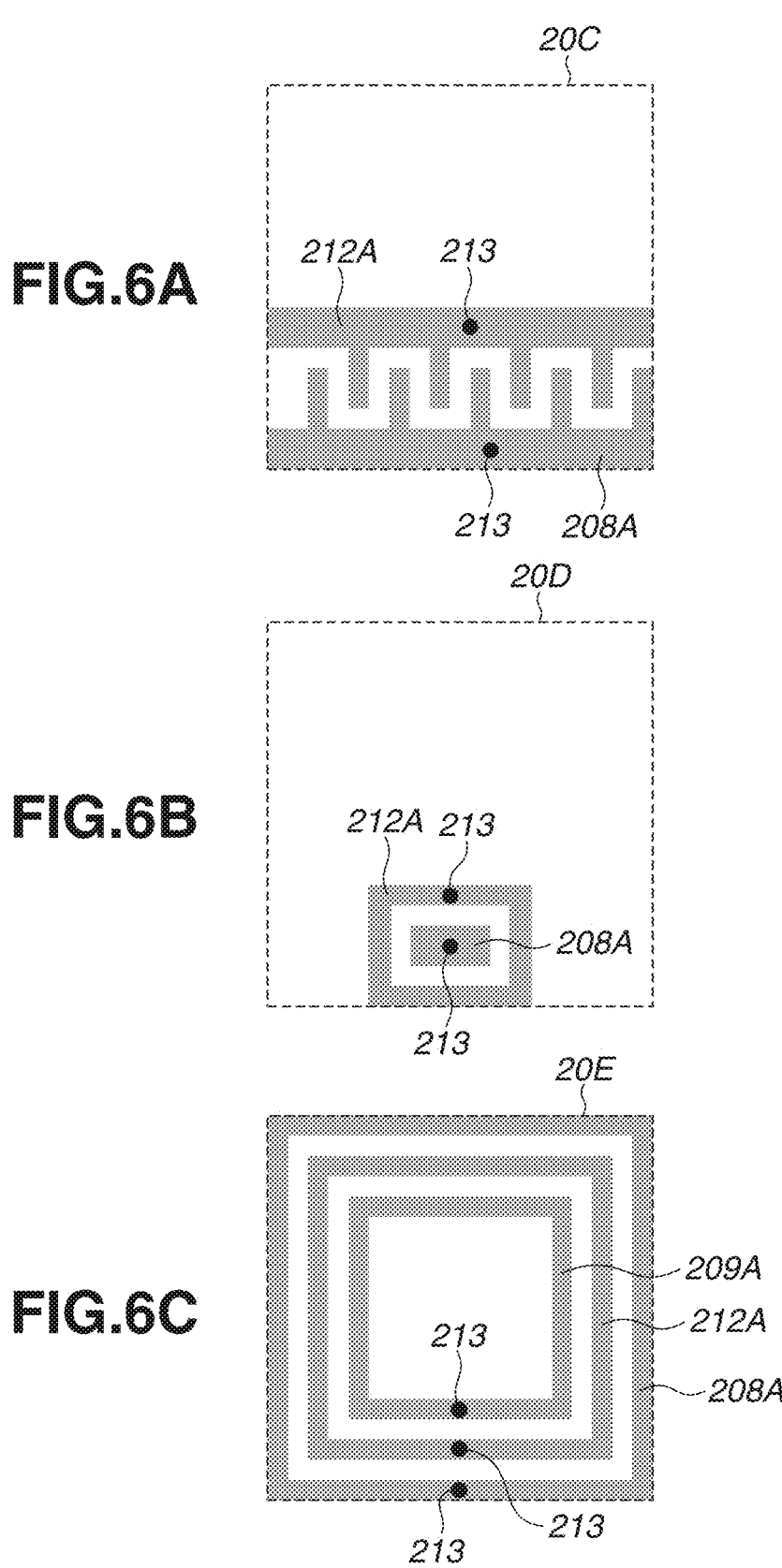
FIGS. 6A, 6B, and 6C are schematic plan views of a pixel according to a third embodiment.

FIGS. 6A, 6B, and 6C are diagrams schematically illustrating a part of the contact plugs 213, and a part of the first wiring layer respectively in a unit pixel 20C, a unit pixel 20D, and a unit pixel 20E.

In the unit pixel 20C illustrated in FIG. 6A, the MOS capacitive element 211 and the conductor 212A of the first wiring layer are electrically connected via the contact plug 213 connected to a source or a drain of the MOS capacitive element 211. The ground 208 and the conductor 208A of the first wiring layer are electrically connected via the contact plug 213 connected to the ground 208.

The MOM capacitance is formed of the conductor 212A, the conductor 208A, and the insulator therebetween. In this way, the wiring capacitive element 212 is formed. It is possible to increase the wiring opposing length to increase the capacitance of the wiring capacitive element 212 with a small area, by arranging the conductor 212A of the first wiring layer and the conductor 208A of the first wiring layer in a staggered manner.

In the unit pixel 20D illustrated in FIG. 6B, the conductor 212A of the first wiring layer electrically connected to the MOS capacitive element 211 is arranged to surround the conductor 208A of the first wiring layer electrically connected to the ground 208. In this way, the wiring capacitive element 212 of the MOM capacitance is formed. It is possible to increase the wiring opposing length to increase the capacitance of the wiring capacitive element 212 with a small area, by arranging the conductor 212A to surround the conductor 208A.

Even if the conductor 212A does not surround all around the conductor 208A, the effect is exhibited. For example, in a case where the conductor 208A is rectangular, the same effect is obtained by surrounding three sides of the conductor 208A by the conductor 212A.

The unit pixel 20E illustrated in FIG. 6C, the conductor 208A of the first wiring layer electrically connected to the ground 208 is provided to surround the conductor 212A of the first wiring layer electrically connected with the MOS capacitive element 211. A conductor 209A of the first wiring layer connected to the power source 209 via the contact plug 213 is provided, and the conductor 212A is provided to surround the conductor 209A. In this way, the wiring capacitive element 212 of the MOM capacitance is formed. Since the conductor 212A is arranged to be sandwiched between the conductor 208A and the conductor 209A, it is possible to increase the wiring opposing length to increase the capacitance of the wiring capacitive element 212 with a small area.

As described above, in the present embodiment, the MOS capacitive element 211 and the wiring capacitive element 212 are electrically connected to the FD 203 via the capacitance addition transistor 210. Thus, it is possible to prevent the degradation in the linearity characteristics and reduce the restriction on the area of the photoelectric conversion unit 201, as compared with a case where the additional capacitance is formed only of the MOS capacitive element 211. According to present embodiment, it is possible to reduce the restriction on the wiring layout, as compared with a case where the additional capacitance is formed only of the wiring capacitive element 212. Thus, it is possible to reduce the sensitivity degradation for, in particular, the FSI type photoelectric conversion device.

Hereinbelow, a fourth embodiment will be described with reference to FIGS. 7, 8A, and 8B.

Figure 7:
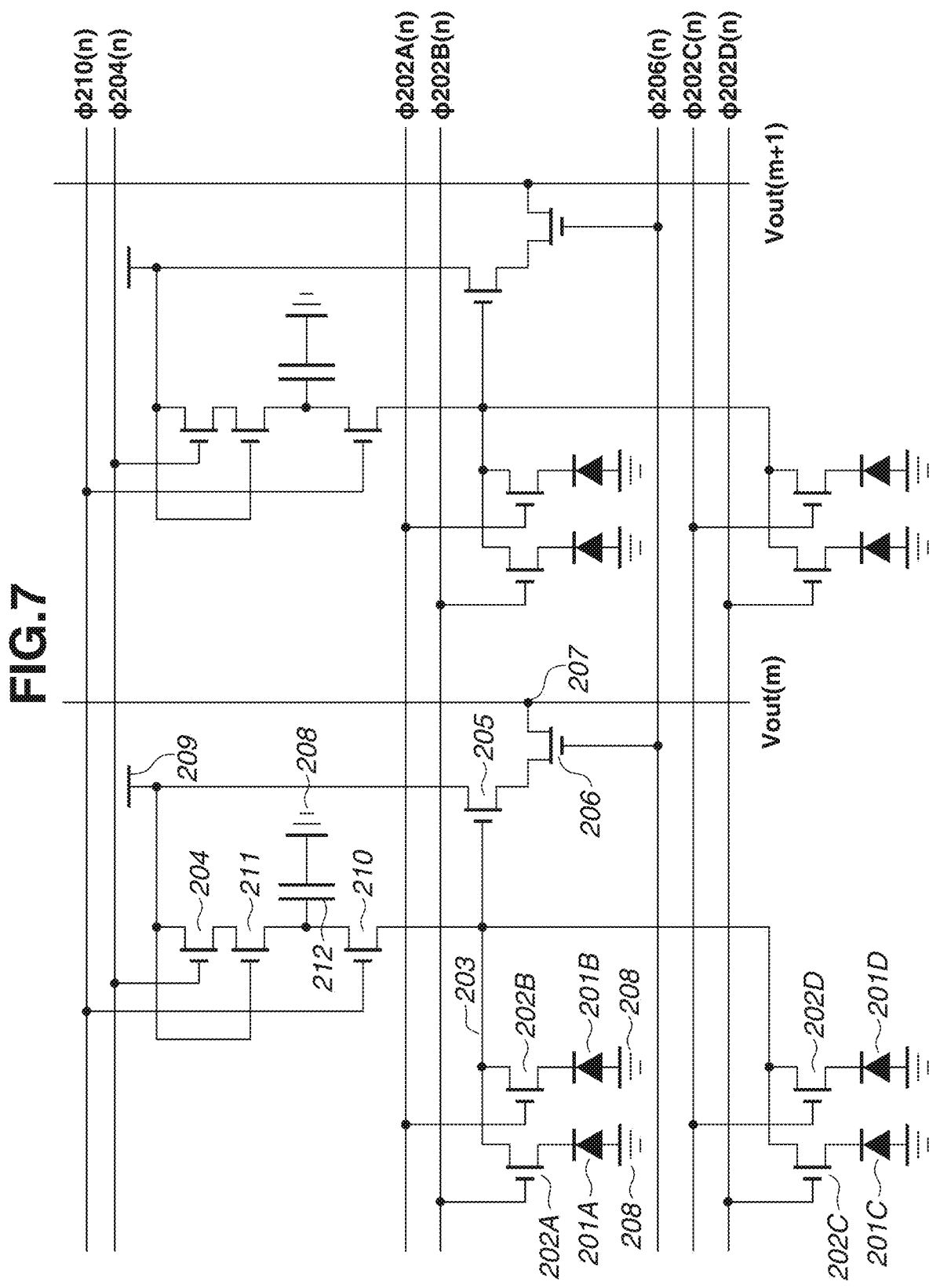
FIG. 7 is a pixel circuit diagram according to a fourth embodiment.

FIG. 7 illustrates an equivalent circuit of pixels of a photoelectric conversion device according to the present embodiment. FIGS. 8A and 8B are schematic plan views illustrating the photoelectric conversion device according to the present embodiment.

In the present embodiment, the equivalent circuit in FIG. 7 is different from the equivalent circuit illustrated in FIG. 4 in that four photoelectric conversion units of a first photoelectric conversion unit 201A, a second photoelectric conversion unit 201B, a third photoelectric conversion unit 201C, and a fourth photoelectric conversion unit 201D share one FD 203 and a readout unit subsequent to the FD 203. By sharing the FD 203 and the readout unit, it is possible to increase the area allocated to each of the photoelectric conversion units 201A, 201B, 201C, and 201D per unit area. Thus, it is possible to increase the saturation charge quantity or the sensitivity of each of the photoelectric conversion units 201A, 201B, 201C, and 201D.

In the present embodiment, one pixel includes two photoelectric conversion units and the phase difference of the output signals of the two photoelectric conversion units is detected, thus implementing the image plane phase difference auto-focus (AF) function. For example, the first photoelectric conversion unit 201A and the second photoelectric conversion unit 201B are provided with a common microlens, and it is possible to obtain light information through different pupils with the first photoelectric conversion unit 201A and the second photoelectric conversion unit 201B.

Figure 8A:
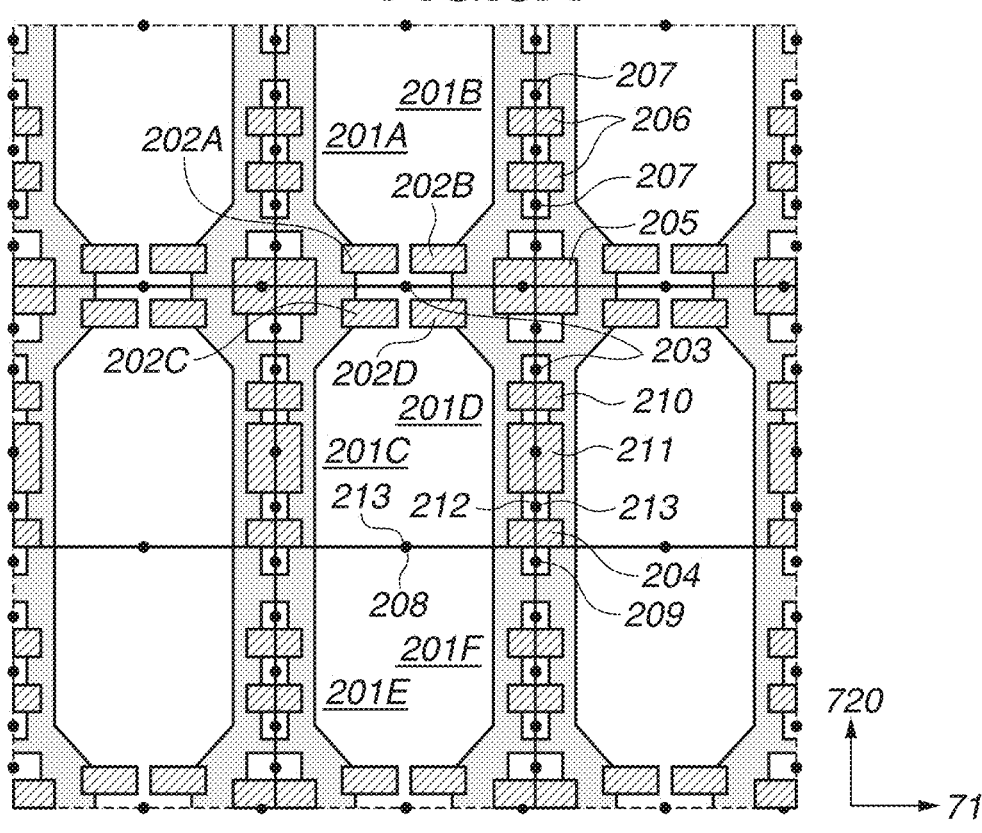
FIGS. 8A and 8B are schematic plan views of a pixel according to the fourth embodiment.
Figure 8B:
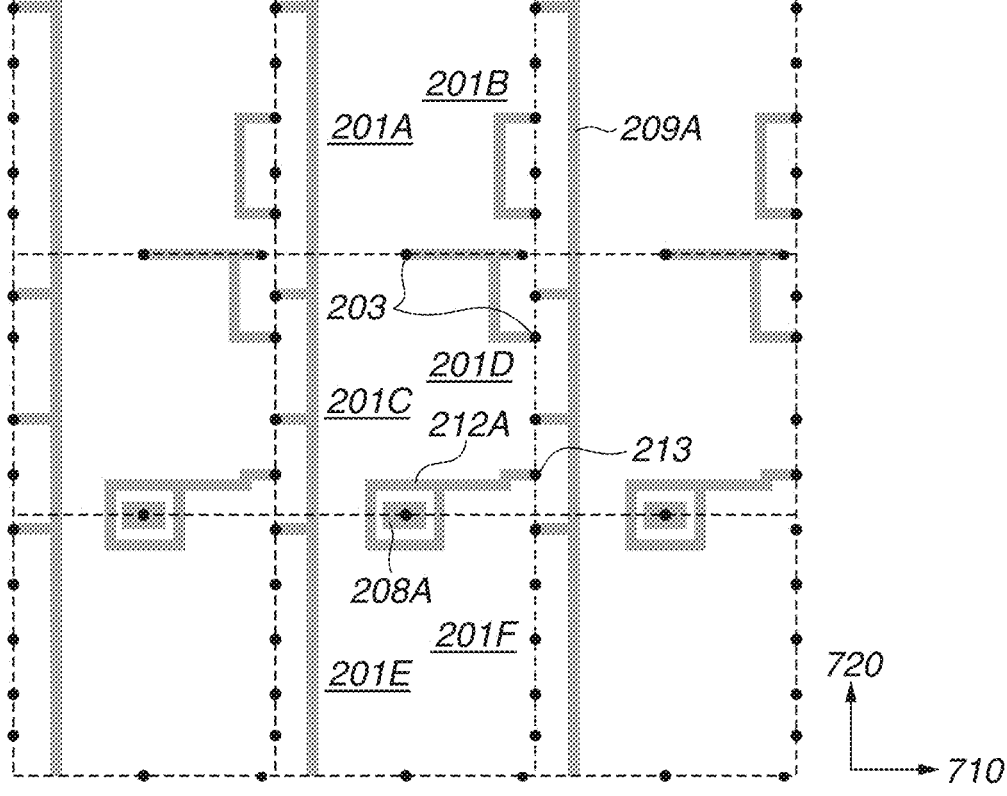

FIG. 8A schematically illustrates active regions, field regions, gate electrodes of transistors, and a part of contact plugs 213. FIG. 8B schematically illustrates a part of the contact plugs 213, and a part of the first wiring layer.

As illustrated in FIG. 8A, gates of a first transfer transistor 202A, a second transfer transistor 202B, a third transfer transistor 202C, and a fourth transfer transistor 202D respectively corresponding to the first photoelectric conversion unit 201A, the second photoelectric conversion unit 201B, the third photoelectric conversion unit 201C, and the fourth photoelectric conversion unit 201D sharing the FD 203 are line-symmetrically arranged. More specifically, the gate of the first transfer transistor 202A and the gate of the second transfer transistor 202B are arranged to be adjacent to each other in a first direction 710. In other words, these gates are line-symmetrically arranged with respect to a second direction 720 orthogonal to the first direction 710. Similarly, the gate of the third transfer transistor 202C and the gate of the fourth transfer transistor 202D are line-symmetrically arranged with respect to the second direction 720.

The gate of the first transfer transistor 202A and the gate of the third transfer transistor 202C are arranged side by side in the second direction 720. In other words, these gates are line-symmetrically arranged with respect to the first direction 710. Similarly, the gate of the second transfer transistor 202B and the gate of the fourth transfer transistor 202D are line-symmetrically arranged with respect to the first direction 710.

With the configuration described above, the gate of the first transfer transistor 202A to the gate of the fourth transfer transistor 202D are rotation-symmetrically arranged. Similarly, also the first photoelectric conversion unit 201A to the fourth photoelectric conversion unit 201D are rotation-symmetrically arranged. Further, the FD 203 is arranged between the first photoelectric conversion unit 201A and the fourth photoelectric conversion unit 201D, and between the second photoelectric conversion unit 201B and the third photoelectric conversion unit 201C.

The third photoelectric conversion unit 201C and a fifth photoelectric conversion unit 201E are arranged to be adjacent each other in the second direction 720, and the fourth photoelectric conversion unit 201D and a sixth photoelectric conversion unit 201F are arranged to be adjacent each other in the second direction 720.

The first photoelectric conversion unit 201A and the second photoelectric conversion unit 201B are provided with a common microlens to form a first pixel. The third photoelectric conversion unit 201C and the fourth photoelectric conversion unit 201D are provided with a common microlens to form a second pixel. Further, the fifth photoelectric conversion unit 201E and the sixth photoelectric conversion unit 201F are provided with a common microlens to form a third pixel.

A PN isolation region (not illustrated) is provided between the first photoelectric conversion unit 201A and the second photoelectric conversion unit 201B. More specifically, crosstalk occurs if the first semiconductor region (e.g., N-type semiconductor region) of the first photoelectric conversion unit 201A and the first semiconductor region (e.g., N-type semiconductor region) of the second photoelectric conversion unit 201B are in contact. For this reason, a semiconductor region of the second conductivity type is provided between these first semiconductor regions as an isolation portion. The portion between the third photoelectric conversion unit 201C and the fourth photoelectric conversion unit 201D has a similar configuration. A semiconductor region of the second conductivity type (not illustrated) is provided also between the third photoelectric conversion unit 201C and the fifth photoelectric conversion unit 201E. The semiconductor region of the second conductivity type provided between the third photoelectric conversion unit 201C and the fifth photoelectric conversion unit 201E is electrically connected to the ground 208 via the contact plug 213. The portion between the fourth photoelectric conversion unit 201D and the sixth photoelectric conversion unit 201F has a similar configuration. A DTI may be provided between the photoelectric conversion units as an isolation portion. Similar configurations are applied to other photoelectric conversion units.

In the present embodiment, the contact plug 213 is connected to the source or the drain of the MOS capacitive element 211 having the gate electrode to which the power source voltage is applied, and the contact plug 213 is electrically connected to the conductor 212A of the first wiring layer. With reference to FIG. 8A, the contact plug 213 is provided between pixels to connect to the ground 208. The contact plug 213 is electrically connected to the conductor 208A of the first wiring layer. The conductor 212A of the first wiring layer is arranged to surround the conductor 208A of the first wiring layer, and the wiring capacitive element 212 of the MOM capacitance is formed of the conductor 212A, the conductor 208A, and the insulator arranged between these conductors. Arrangement of the conductor 212A to surround the conductor 208A increases the wiring opposing length with a small area, thus increasing the capacitance of the wiring capacitive element 212.

In addition, in a case of a mirror layout as illustrated in FIG. 8A, the gates of the four transfer transistors 202A, 202B, 203C, and 202D are provided in a concentrated manner. To drive these four transfer transistors 202A, 202B, 203C, and 202D, four drive wiring conductors (not illustrated) are to be provided, and the area of the aperture region of the respective photoelectric conversion units is restricted due to the four drive wiring conductors in the case of the FSI type photoelectric conversion device. Here, the aperture region of the photoelectric conversion units is a sensitive region that is not covered by the traces of wiring or the like in the photoelectric conversion units. This brings about the asymmetry property in the area of the aperture region of the respective photoelectric conversion units in the second direction 720. More specifically, the drive wiring conductors for the transfer transistors 202A, 202B, 203C, and 202D and the FD 203 are provided between the first and second photoelectric conversion units 201A and 201B constituting the first pixel, and the third and fourth photoelectric conversion units 201C and 201D constituting the second pixel. Thus, the area of the aperture region of the respective photoelectric conversion units becomes small when viewed from the optical center of the photoelectric conversion units determined in consideration of light concentrated by the microlens. In contrast, neither gate nor the FD is provided between the third and fourth photoelectric conversion units 201C and 201D constituting the second pixel, and the fifth and sixth photoelectric conversion units 201E and 201F constituting the third pixel. Thus, the area of the aperture region of the respective photoelectric conversion units becomes large when viewed from the optical center of the photoelectric conversion units. In other words, in the first pixel and the second pixel, the areas of the aperture regions from the optical center of the respective photoelectric conversion units becomes asymmetric with respect to the second direction 720. Thus, the incident angle characteristics are different in the second direction 720.

According to the present embodiment, since the conductor 208A is arranged between the second pixel and the third pixel, the conductors 212A and 208A constituting the wiring capacitive element 212 are arranged between the second pixel and the third pixel. For this reason, in the case of the FSI type photoelectric conversion device, the area of the aperture region of the respective photoelectric conversion units is restricted by the conductors 212A and 208A. In this way, the difference in the areas of the aperture regions in the up and down directions from the optical center of the respective photoelectric conversion units along the second direction 720 is reduced between the first pixel, the second pixel, and the third pixel. This enables the incident angle characteristics to be further uniformed in the first pixel, the second pixel, and the third pixel in the second direction 720.

As described above, in the present embodiment, the MOS capacitive element 211 and the wiring capacitive element 212 are electrically connected to the FD 203 via the capacitance addition transistor 210. Thus, it is possible to prevent the degradation in the linearity characteristics and reduce the restriction on the area of the photoelectric conversion units, as compared with a case where the additional capacitance is formed only of the MOS capacitive element 211. According to the present embodiment, it is possible to reduce the restriction on the wiring layout as compared with a case where the additional capacitance is formed only of the wiring capacitive element 212. Thus, it is possible to prevent the sensitivity degradation for, in particular, the FSI type photoelectric conversion device.

A fifth embodiment will be described. Any of the first to the fourth embodiments can be applied to the fifth embodiment. FIG. 9A is a diagram schematically illustrating an apparatus 9191 including a semiconductor device 930 according to the present embodiment. The photoelectric conversion device according to any of the embodiments is usable in the semiconductor device 930. The apparatus 9191 including the semiconductor device 930 will be described in detail. The semiconductor device 930 can include a package 920 containing a semiconductor device 910, in addition to the semiconductor device 910. The package 920 can include a base member to which the semiconductor device 910 is fixed, and a cover, such as a glass plate, facing the semiconductor device 910. Further, the package 920 can include connection members, such as bonding wires and bumps, for connecting terminals provided on the base member to terminals provided on the semiconductor device 910.

The apparatus 9191 can include any one of an optical device 940, a control device 950, a processing device 960, a display device 970, a storage device 980, and a mechanical device 990. The optical device 940 is compatible with the semiconductor device 930. The optical device 940 is, for example, a lens, a shutter, and a mirror. The control device 950 controls the semiconductor device 930. The control device 950 is a semiconductor device, such as an application specific integrated circuit (ASIC).

The processing device 960 processes a signal output from the semiconductor device 930. The processing device 960 is a semiconductor device, such as a central processing unit (CPU) and an ASIC, for constituting an analog front end (AFE) or a digital front end (DFE). The display device 970 is an electroluminescence (EL) display device or a liquid crystal display device for display information (image) obtained by the semiconductor device 930. Examples of the storage device 980 include an electromagnetic device or a semiconductor device for storing information (image) obtained by the semiconductor device 930. Further, examples of the storage device 980 include a volatile memory, such as a static random access memory (SRAM) and a dynamic random access memory (DRAM), and a non-volatile memory, such as a flash memory and a hard disk drive.

The mechanical device 990 includes a movable part or a driving part, such as a motor and an engine. The apparatus 9191 displays a signal output from the semiconductor device 930 on the display device 970, or transmits the signal to the outside via a communication device (not illustrated) included in the apparatus 9191. Thus, the apparatus 9191 may desirably further include the storage device 980 and the processing device 960 separately from a storage circuit and a calculation circuit included in the semiconductor device 930. The mechanical device 990 may be controlled based on the signal output from the semiconductor device 930.

The apparatus 9191 is suitable for an electronic apparatus, such as an information terminal having an image capturing function (e.g., smartphone and wearable terminal), a camera (e.g., interchangeable lens camera, compact camera, video camera, and monitoring camera). The mechanical device 990 in the camera can drive components of the optical device 940 to perform zooming, focusing, and shutter operation. Further, the mechanical device 990 in the camera is able to move the semiconductor device 930 for image stabilization operation.

The apparatus 9191 can be a transport apparatus, such as a vehicle, a ship, and a flight vehicle. The mechanical device 990 in the transport apparatus can be used as a movable apparatus. For example, the apparatus 9191 as the transport apparatus is suitable for an apparatus for transporting the semiconductor device 930, or for performing assist and/or automatization of the driving (operation) using the image capturing function. The processing device 960 for the assist and/or the automatization of the driving (operation) can perform processing for operating the mechanical device 990 serving as the movable apparatus based on the information obtained by the semiconductor device 930. Alternatively, the apparatus 9191 may be a medical apparatus, such as an endoscope, a measurement apparatus, such as a distance measuring sensor, an analysis apparatus, such as an electron microscope, an office machine, such as a copying machine, and an industrial machine, such as a robot.

According to the embodiment described above, a good pixel characteristic is obtainable. Thus, it is possible to enhance the value of the semiconductor device. The term "to enhance the value" here corresponds to at least any of function addition, improvements of performance, character-istics, reliability, and manufacturing yield, and reductions of environmental load, cost, size, and weight.

Thus, when the semiconductor device 930 according to the present embodiment is used for the apparatus 9191, the value of the apparatus 9191 is also able to be enhanced. For example, in a case where the semiconductor device 930 is installed in the transport apparatus to capture an image outside the transport apparatus, or measure an external environment, it is possible to obtain an excellent perfor-mance. Thus, it is advantageous for the productions and the sales of transport apparatuses if it is determined that the semiconductor device 930 according to the present embodi-ment is installed, in terms of enhancement of the perfor-mance of the transport apparatus. In particular, the semi-conductor device 930 is suitable for the transport apparatus that performs driving assistance and/or automatic driving using the information obtained by the semiconductor device 930.

With reference to FIGS. 9B and 9C, a photoelectric conversion system and a movable body will be described.

FIG. 9B illustrates an example of the photoelectric con-version system related to a car-mounted camera. A photo-electric conversion system 8 includes a photoelectric con-version device 80. The photoelectric conversion device 80 is a photoelectric conversion device (imaging device) described in any of the embodiments described above. The photoelectric conversion system 8 includes an image pro-cessing unit 801 and a parallax obtaining unit 802. The image processing unit 801 performs image processing on a plurality of pieces of image data obtained by the photoelec-tric conversion device 80. The parallax obtaining unit 802 calculates a parallax (i.e., phase difference between parallax images) from the plurality of pieces of image data obtained by the photoelectric conversion system 8. Further, the pho-toelectric conversion system 8 includes a distance obtaining unit 803 for calculating a distance to an object based on the calculated parallax, and a collision determination unit 804 for determining whether there is a possibility of collision based on the calculated distance. In the present embodiment, the parallax obtaining unit 802 and the distance obtaining unit 803 are an example of a distance information obtaining unit for obtaining the distance information to the object. In other words, the distance information relates to a parallax, a defocus amount, a distance to an object, and the like. The collision determination unit 804 may determine the possi-bility of collision using any of pieces of the distance information. The distance information obtaining unit may be implemented by a specifically designed hardware compo-nent, or software modules. The distance information obtain-ing unit may be implemented by a Field Programmable Gate Array (FPGA) or an ASIC, or a combination thereof.

The photoelectric conversion system 8 is connected to a vehicle information obtaining device 810, and is able to obtain vehicle information, such as a vehicle speed, a yaw rate, and a steering angle. Further, the photoelectric conver-sion system 8 is connected to an electronic control unit (ECU) 820. The ECU 820 is a control device configured to output a control signal for generating a braking force in the vehicle based on the determination result made by the collision determination unit 804. The photoelectric conver-sion system 8 is also connected to an alarm apparatus 830 configured to output an alarm to a driver of the vehicle based on the determination result made by the collision determi-nation unit 804. For example, in a case where a result of the determination made by the collision determination unit 804 indicates that the possibility of collision is high, the ECU 820 controls the vehicle to avoid collision or reduce damage by braking, releasing an accelerator pedal, and/or reducing an output engine power. The alarm apparatus 830 gives a warning to a user by giving an alert by a sound or the like, displaying alarm information on a screen of a car navigation system or the like, or giving vibrations to a sheet belt and/or a steering wheel.

In the present embodiment, the photoelectric conversion system 8 captures an image of the surroundings of the vehicle, for example, in front or behind of the vehicle.

FIG. 9C illustrates the photoelectric conversion system 8 in a case of capturing an image on the front side of the vehicle (imaging range 850). The vehicle information obtaining device 810 transmits an instruction to the photo-electric conversion system 8 or the photoelectric conversion device 80. Such a configuration further enhances the accu-racy of the distance measurement.

In the above-described embodiment, the example of con-trolling the vehicle so as not to collide with another vehicle has been described. The present embodiment is applicable also to control a vehicle to perform automatic driving to follow another vehicle, and to perform automatic driving so as not to run out of a traffic lane. Further, the present embodiment is applicable also to, for example, a movable body (movable apparatus), such as a ship, an aircraft, and an industrial robot, in addition to the vehicles such as a car. Moreover, in addition to the movable body, the present embodiment is applicable also to apparatuses that use an object recognition function, such as an intelligent transport system (ITS).

Various modifications are possible without being limited to the above-described embodiment. Examples in which a part of the configuration in any of the embodiments is added to another embodiment, or a part of the configuration is replaced with a part of the configuration in another embodi-ment are also included in the embodiments of the present disclosure. The embodiments of the present disclosure are applicable to both of the FSI type photoelectric conversion device and the BSI type photoelectric conversion device.

While the present disclosure has been described with reference to embodiments, it is to be understood that the disclosure is not limited to the disclosed embodiments. The scope of the following claims is to be accorded the broadest interpretation so as to encompass all such modifications and equivalent structures and functions.

This application claims the benefit of priority from Japa-nese Patent Application No. 2022-122764, filed Aug. 1, 2022, which is hereby incorporated by reference herein in its entirety.

What is claimed is:
1. A photoelectric conversion device comprising:
a photoelectric conversion unit configured to convert light into charge;

a floating diffusion to which the charge is transferred from the photoelectric conversion unit;

an amplification transistor electrically connected to the floating diffusion;

a capacitance addition transistor electrically connected to the floating diffusion;

a metal-oxide semiconductor capacitive element electrically connected to the floating diffusion via the capacitance addition transistor; and a wiring capacitive element electrically connected to the floating diffusion via the capacitance addition transistor.

2. The photoelectric conversion device according to claim 1, wherein a contact plug is connected to a source or a drain of a transistor serving as the metal-oxide semiconductor capacitive element, and wherein the contact plug and the wiring capacitive element are electrically connected.

3. The photoelectric conversion device according to claim 2, further comprising a trace of ground wiring and a trace of power source wiring that are configured to supply a voltage to the photoelectric conversion unit, wherein a trace of wiring electrically connected to the contact plug surrounds the trace of ground wiring or the trace of power source wiring in a planar view, so that the wiring capacitive element is formed.

4. The photoelectric conversion device according to claim 1, wherein the metal-oxide semiconductor capacitive element and the wiring capacitive element are connected to the floating diffusion in parallel.

5. The photoelectric conversion device according to claim 1 further comprising:

a power source electrically connected to the amplification transistor; and a reset transistor disposed between the floating diffusion and the power source, wherein the capacitance addition transistor, the metal-oxide semiconductor capacitive element, and the wiring capacitive element are disposed between the reset transistor and the floating diffusion.

6. The photoelectric conversion device according to claim 1, wherein the wiring capacitive element is formed from metal-insulator-metal capacitance.

7. The photoelectric conversion device according to claim 1, wherein the wiring capacitive element is formed from metal-oxide-metal capacitance.

8. The photoelectric conversion device according to claim 3, further comprising:

a first photoelectric conversion unit;

a second photoelectric conversion unit adjacent to the first photoelectric conversion unit in a first direction;

a third photoelectric conversion unit adjacent to the first photoelectric conversion unit in a second direction orthogonal to the first direction;

a fourth photoelectric conversion unit adjacent to the third photoelectric conversion unit in the first direction;

a fifth photoelectric conversion unit adjacent to the third photoelectric conversion unit in the second direction; and a sixth photoelectric conversion unit adjacent to the fourth photoelectric conversion unit in the second direction, wherein a first pixel includes the first photoelectric conversion unit and the second photoelectric conversion unit, wherein a second pixel includes the third photoelectric conversion unit and the fourth photoelectric conversion unit, wherein a third pixel includes the fifth photoelectric conversion unit and the sixth photoelectric conversion unit, wherein the trace of ground wiring is disposed between the second pixel and the third pixel, and wherein the trace of wiring electrically connected to the contact plug surrounds the trace of ground wiring in a planar view, so that the wiring capacitive element is formed.

9. The photoelectric conversion device according to claim 8, further comprising:

a gate of a first transfer transistor configured to transfer charge from the first photoelectric conversion unit to the floating diffusion;

a gate of a second transfer transistor configured to transfer charge from the second photoelectric conversion unit to the floating diffusion;

a gate of a third transfer transistor configured to transfer charge from the third photoelectric conversion unit to the floating diffusion; and a gate of a fourth transfer transistor configured to transfer charge from the fourth photoelectric conversion unit to the floating diffusion, wherein the gate of the first transfer transistor, the gate of the second transfer transistor, the gate of the third transfer transistor, and the gate of the fourth transfer transistor are disposed between the first pixel and the second pixel.

10. An apparatus including the photoelectric conversion device according to claim 1, the apparatus further comprising at least one of:

an optical device compatible with the photoelectric conversion device;

a control device configured to control the photoelectric conversion device;

a processing device configured to process a signal output from the photoelectric conversion device;

a display device configured to display information obtained by the photoelectric conversion device;

a storage device configured to store the information obtained by the photoelectric conversion device; or a mechanical device configured to operate based on the information obtained by the photoelectric conversion device.

* * * * *